(12) United States Patent
Yoo et al.

(10) Patent No.: US 8,943,965 B2
(45) Date of Patent: Feb. 3, 2015

(54) ROLLER APPARATUS, PRINTING METHOD AND METHOD OF FABRICATING LIQUID CRYSTAL DISPLAY DEVICE USING THE SAME

(75) Inventors: Soon Sung Yoo, Gyeonggi-do (KR); Youn Gyoung Chang, Gyeonggi-do (KR); Seung Hee Nam, Gyeonggi-do (KR); Nam Kook Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 1740 days.

(21) Appl. No.: 12/003,317

(22) Filed: Dec. 21, 2007

(65) Prior Publication Data

US 2008/0184904 A1 Aug. 7, 2008

(30) Foreign Application Priority Data

Feb. 6, 2007 (KR) .......................... 10-2007-0011909

(51) Int. Cl.
*B41M 1/08* (2006.01)
*B41M 1/10* (2006.01)
*B41F 7/00* (2006.01)
*B41F 9/00* (2006.01)

(52) U.S. Cl.
USPC ............ 101/483; 101/141; 101/153; 101/216

(58) Field of Classification Search
CPC ............ B41M 1/06; B41M 1/08; B41M 1/10; B41F 7/00; B41F 9/00
USPC .............. 101/483, 217, 492, 241, 382.1, 383, 101/378, 216, 141, 153
See application file for complete search history.

(56) References Cited

U.S. PATENT DOCUMENTS

| | | | | |
|---|---|---|---|---|
| 5,127,330 | A | * | 7/1992 | Okazaki et al. ............ 101/450.1 |
| 6,041,706 | A | * | 3/2000 | Murray ......................... 101/217 |
| 6,207,268 | B1 | | 3/2001 | Kosaka et al. |
| 6,736,270 | B2 | * | 5/2004 | Adams et al. ................. 209/399 |
| 6,759,118 | B2 | * | 7/2004 | Finn et al. ..................... 428/323 |
| 2005/0115429 | A1 | * | 6/2005 | Link ........................ 101/463.1 |
| 2007/0157841 | A1 | * | 7/2007 | Yoo et al. ...................... 101/492 |
| 2008/0028964 | A1 | * | 2/2008 | McEachern ................... 101/383 |
| 2009/0085999 | A1 | * | 4/2009 | Furukawa ..................... 347/102 |
| 2010/0089262 | A1 | * | 4/2010 | Seong et al. .................. 101/158 |

FOREIGN PATENT DOCUMENTS

| | | | |
|---|---|---|---|
| JP | 07000907 A | * | 1/1995 |
| JP | 2005-353770 A | | 12/2005 |
| KR | 10-0528422 | | 1/2006 |

OTHER PUBLICATIONS

Office Action from the Korean Patent Office dated Jan. 25, 2013 in counterpart Korean application No. 10-2007-0011909.

* cited by examiner

*Primary Examiner* — Blake A Tankersley
(74) *Attorney, Agent, or Firm* — Morgan, Lewis & Bockius LLP

(57) ABSTRACT

Provided are a roller apparatus, a printing method and a method of fabricating an LCD device using the same, which can minimize the number of processes and a printing defect. In the printing method, first patterns are formed on a blanket. The first patterns have different surface energy from that of the blanket, and the blanket is formed around a roller. The roller is rotated and a printing material is dropped to form second patterns on the blanket between the first patterns. The second patterns are transferred from the roller onto a substrate.

10 Claims, 5 Drawing Sheets

Fig. 1A – Prior Art
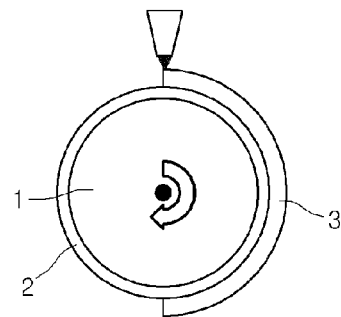
Fig. 1B – Prior Art
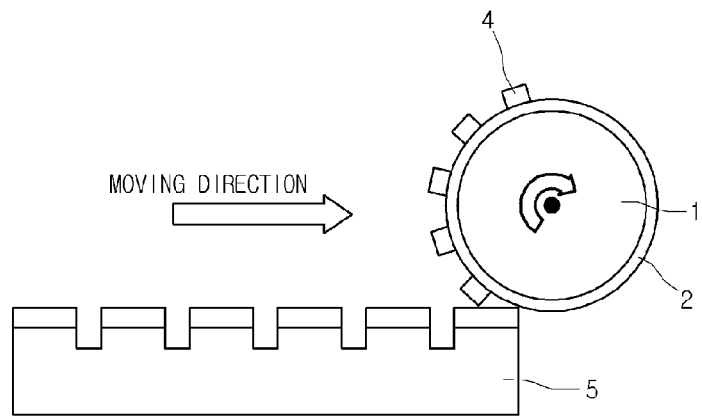

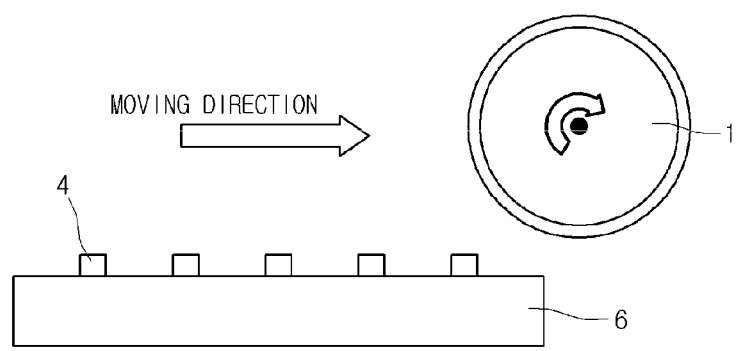
Fig. 1C - Prior Art
Fig. 2A
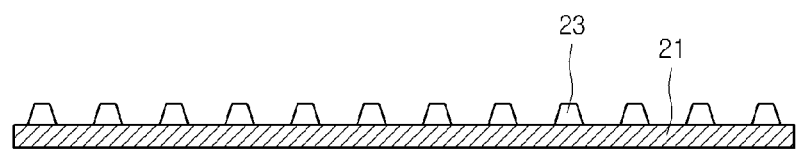
Fig. 2B

ROLLER APPARATUS, PRINTING METHOD AND METHOD OF FABRICATING LIQUID CRYSTAL DISPLAY DEVICE USING THE SAME

CROSS-REFERENCE TO RELATED APPLICATIONS

The present application claims priority under 35 U.S.C. 119 and 35 U.S.C. 365 to Korean Patent Application No. 10-2007-0011909 filed on Feb. 6, 2007, which is hereby incorporated by reference in its entirety.

BACKGROUND

The present disclosure relates to a printing method, and more particularly, to a roller apparatus, a printing method, and a method of fabricating a liquid crystal display (LCD) device using the same, which can simplify a process and minimize a printing defect.

As an information-oriented society is developed, demands for display devices also increase. To meet the increasing demands, researches have been conducted on various flat display devices including an LCD device, a plasma display panel (PDP) and an electroluminescent display (ELD), some of which are already being widely used as display devices.

Particularly, the LCD device has advantages of good image quality, lightness, a thin profile, and low power consumption, and is quickly substituting for a cathode ray tube (CRT). The LCD device can be applied in various fields, e.g., a monitor of a notebook computer and a display panel of a television.

The LCD device includes a liquid crystal panel for displaying an image, and a driver for driving a liquid crystal panel.

The liquid crystal panel includes a liquid crystal layer between two substrates. An alignment direction of liquid crystal molecules of the liquid crystal layer is controlled by a voltage applied to respective electrodes provided on the two substrates, thereby controlling light transmittance to display an image.

The liquid crystal panel includes various patterns, e.g., a gate line, a data line, a thin film transistor, a pixel electrode, and a common electrode.

To form those patterns, a photoresist pattern can be formed by cleaning, exposure and development processes, and an etch process can be performed by using the photoresist pattern as a mask.

Since expensive exposure equipment must be used, a fabrication cost increases. Also, since a plurality of processes are performed, a fabricating process becomes complicated.

Recently, a printing method has been proposed, in which a printing pattern is formed by a printing process and a pattern is formed by using the printing pattern as a mask, instead of using a photoresist pattern.

FIGS. 1A to 1C illustrate a process of forming a printing pattern by using a related art printing method.

Referring to FIG. 1A, a roller 1 has a circular section, and is rotatable and movable in one horizontal direction. A blanket 2 with uniform thickness is disposed around a surface of the roller 1.

As the roller 1 rotates after a printing material 3 is dropped onto the blanket 2, the surface of the blanket 2 is coated with the printing material 3.

Referring to FIG. 3, a cliché 5 is provided to form a pattern from the printing material of the roller 1. The cliché 5 includes a plurality of patterns.

After the roller 1 coated with the printing material 3 contacts the cliché 5, the roller 1 rotates on the cliché 5, moving in one horizontal direction. Then, the pattern of the cliché 5 is transferred onto the roller 1, so that a printing pattern 4 corresponding to the pattern of the cliché 5 is formed from the printing material 3 of the roller 1. That is, because of the pattern of the cliché 5, a portion of the printing material 3 of the roller 1 contacting the cliché 5 attaches to the cliché 5, and the other portion of the printing material 3 that does not contact the cliché 5 remains on the roller 1.

Referring to FIG. 1C, a glass substrate 6 is provided.

After the roller 1 including the printing pattern 4 contacts the glass substrate 6, the roller 1 rotates on the glass substrate 6, moving in one horizontal direction. Accordingly, the printing pattern 4 on the roller 1 is transferred onto the glass substrate 6.

As described above, the related art printing method requires three processes of coating a roller with a printing material, forming a printing pattern onto a roller by using a cliché, and forming a printing pattern of a roller. Consequently, a process becomes complicated.

Also, if an optimum process condition is not satisfied in each process and between processes during a plurality of processes, a printing defect may occur. For example, in the case where a pattern of a cliché has a small height difference, if a roller forcibly presses the cliché, a printing material that should remain on the roller may contact the cliché and attach to the cliché. Consequently, a desired pattern may not be formed on the roller, failing to form a desired pattern on a substrate.

SUMMARY

Accordingly, the present invention is directed to a liquid crystal display (LCD) device that substantially obviates one or more of the problems due to limitations and disadvantages of the related art.

Embodiments provide a roller apparatus, a printing method, and a method of fabricating an LCD device using the same, which can simplify a process and minimize a printing defect.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In one embodiment, a printing method includes: forming first patterns on a blanket, the first patterns having different surface energy from the blanket; forming the blanket around a roller; rotating the roller and dropping a printing material to form second patterns on the blanket between the first patterns; and transferring the second patterns onto a substrate.

In another embodiment, a method of fabricating a liquid crystal display device includes: providing a roller including second patterns on a blanket between first patterns; depositing a pattern material on a substrate; transferring the second patterns onto the pattern material; and patterning the pattern material using the second patterns as a mask to form third patterns on the substrate.

In a further embodiment, a roller apparatus includes: a roller; a blanket having first surface energy, the blanket being attached around the roller; and patterns on the blanket, the patterns having second surface energy different from the first surface energy.

According to embodiments, a fabrication process can be simplified, and a fabrication cost can be saved, and a printing defect can be minimized.

It is to be understood that both the foregoing general description and the following detailed description of the present invention are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

FIGS. 1A to 1C are views illustrating a process of forming a printing pattern using a related art printing method.

FIGS. 2A to 2F are views illustrating a printing process according to an embodiment.

DETAILED DESCRIPTION OF THE EMBODIMENTS

Reference will now be made in detail to the embodiments of the present disclosure, examples of which are illustrated in the accompanying drawings.

FIGS. 2A to 2F are views for explaining a printing process according to an embodiment.

Referring to FIG. 2A, a blanket 21 with a uniform thickness is provided. The blanket 21 may be formed of polydimethylsiloxane (PDMS). Surface energy of PDMS ranges from approximately 22 dynes/cm$^2$ to approximately 24 dynes/cm$^2$.

Referring to FIG. 2B, a material, e.g., polytetrafluoroethylene (Teflon) having lower surface energy than the PDMS is deposited on the blanket 21 and pattered to form first patterns 23. Surface energy of Teflon ranges from approximately 18 dynes/cm$^2$ to approximately 20 dynes/cm$^2$.

Figure 2C:
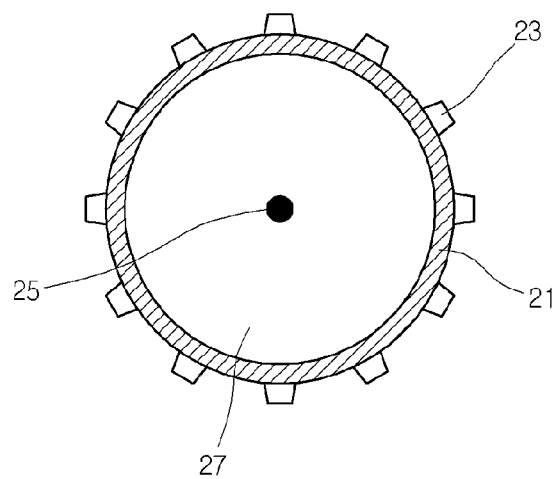

Referring to FIG. 2C, the blanket 21 including the first patterns 23 is attached along a surface circumference of the roller 27 having a circular section. Since the roller 27 has the circular section, one end of the blanket 21 contacts the other end thereof. The ends of the blanket 21 that contact each other are fixed and connected by using an adhering unit.

The roller 27 includes a shaft 25 rotatably placed at a central area of the roller 27. The roller 27 is fixedly connected to the shaft 25. Accordingly, as the shaft 25 rotates, the roller 27 can rotate clockwise or counterclockwise about the shaft 25. A rotation motor may be provided at one side of the shaft 25 to rotate the shaft 25.

Also, the roller 27 may be connected to a moving member to be moved horizontally in one direction.

Accordingly, a roller apparatus includes the roller 27, the shaft 25, the blanket 21, and the first patterns 23. The roller 27 has a cylindrical shape. The shaft 25 penetrates a central area of the roller 27 and is coupled to the roller 27 for rotation of the roller 27. The blanket 21 is attached around the roller 27 and has first surface energy. The first patterns 23 are formed on the blanket 21 and have second surface energy different from that of the first surface energy.

The blanket 21 may be formed of PDMS. The first patterns 23 may be formed of a Teflon material. The first surface energy ranges from approximately 22 dynes/cm$^2$ to approximately 24 dynes/cm$^2$, and the second surface energy ranges from approximately 18 dynes/cm$^2$ to approximately 20 dynes/cm$^2$.

The second surface energy may be lower than the first surface energy. For this reason, when a printing material to be described later is dropped along a circumference of the roller 27, the printing material can be introduced onto the blanket 21 having higher surface energy than the first patterns 23. In other words, the blanket 21 is exposed between the first patterns 23, and the printing material can be formed mainly on the exposed blanket 21 having relatively higher surface energy, rather on the first patterns 23. Accordingly, the printing material on the exposed blanket 21 between the first patterns 23 can be transferred onto the roller 27 as printing patterns.

Thus, the printing patterns can be transferred onto a substrate as they are.

A method of forming printing patterns on a substrate by using the roller apparatus will now be described.

Figure 2D:
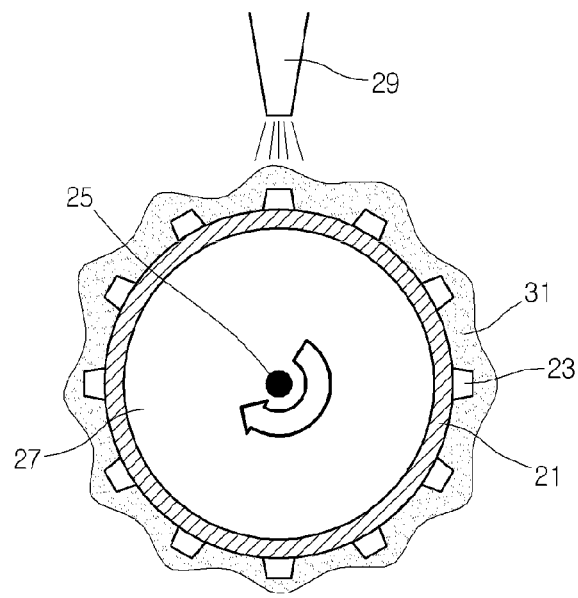

Referring to FIG. 2D, a dropping member 29 may be provided above the blanket 21 of the roller 27. A printing material may be dropped downwardly by the dropping member 29. The printing material may be any material that can serve as a mask.

When the printing material is dropped through the dropping member 29, the roller 27 rotates clockwise. Although the roller 27 rotates clockwise in an embodiment, the roller 27 may rotate counterclockwise.

AS the roller 27 rotates, the printing material dropped through the dropping member 29 is coated on the blanket 21 including the first patterns 23 of the roller 27.

Figure 2E:
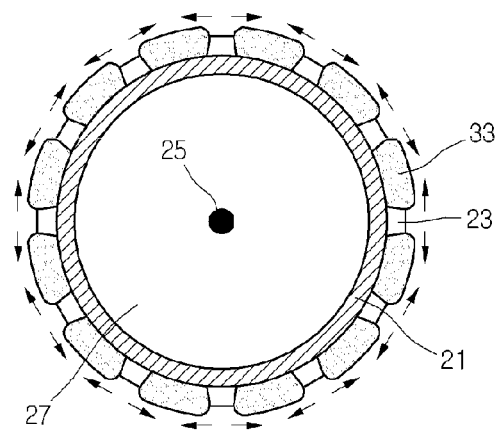

Referring to FIG. 2E, since the surface energy of the blanket 21 is lower than that of the first patterns 23, the printing material is easily formed on the blanket 21 rather on the first patterns 23. Accordingly, the printing material is formed on the blanket 21 exposed between the first patterns 23, thereby forming printing patterns 33 (hereinafter, referred to as second patterns) between the first patterns 23.

The printing material on the first patterns 23 mostly flows onto the blanket 21, so that thickness of the second patterns 33 between the first patterns 23 becomes greater than that of the first patterns 23.

The roller 27 may vibrate to quickly, easily and accurately form the second patterns 33 between the first patterns 23.

The rotation motor provided at the shaft 25 may also serve as a vibration motor. If necessary, the rotation motor may have both functions of rotating and vibrating.

When the roller 27 vibrates, the printing material on the first patterns 23 having lower surface energy easily flows from the first patterns 23 toward the blanket 21 having higher surface energy than the first patterns 23.

Since the vibration of the roller 27 causes all of the printing material to flow from the first patterns 23 toward the blanket 21, no printing material remains on the first patterns 23.

Also, the vibration of the roller 27 allows the printing material on the first patterns 23 to quickly move onto the blanket 21.

Consequently, since all of the printing material on the first patterns 23 moves onto the blanket 21 between the first patterns 23, the printing material on the first patterns 23 is placed on the blanket 21 and no printing material remains on the first patterns 23. Accordingly, the second patterns 33 having greater thickness than the first patterns 23 are formed on the blanket 21.

Figure 2F:
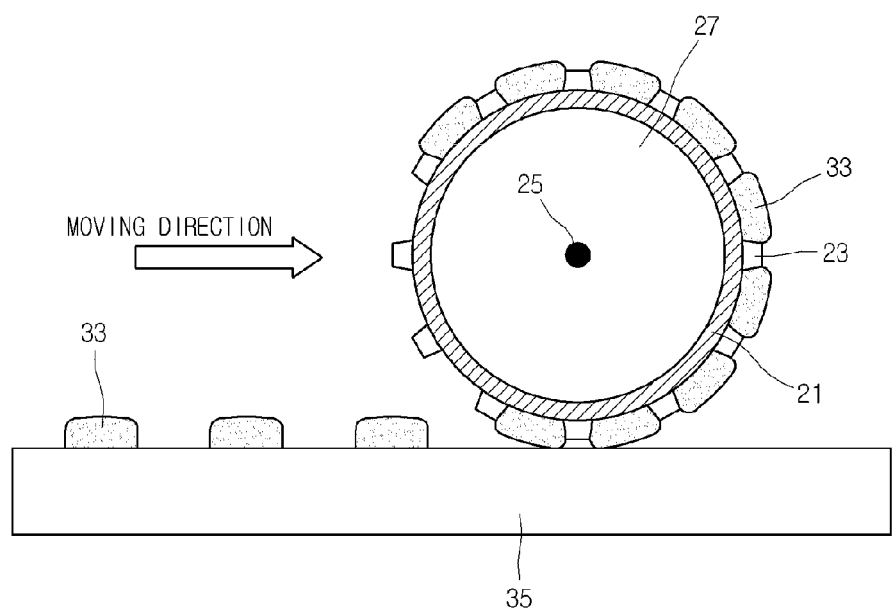

Referring to FIG. 2F, the roller 27 including the second patterns 23 contacts a substrate 35, and then the roller 27 rotates clockwise on the substrate 35, moving in one horizontal direction.

The substrate 35 is formed of a glass material, and surface energy of the glass is approximately 47 dynes/cm². The surface energy of the glass substrate 35 is higher than the surface energy of the second patterns 33 formed on the roller 27. For this reason, when the second patterns 33 on the roller 27 contact the glass substrate, the second patterns 33 can be easily transferred onto the glass substrate.

As the roller 27 contacts the glass substrate 35 and rotates clockwise, moving in one horizontal direction, the second patterns 33 on the roller 27 are formed on the glass substrate 35.

Because of the greater thickness of the second patterns 33 than that of the first patterns 23, only the second patterns 33 contact the glass substrate 35. For this reason, the second patterns 33 can be easily transferred from the roller 27 to the second patterns 33.

According to an embodiment, the blanket 21 having higher surface energy than the first patterns 23 is formed on the roller 27, so that all of the printing material dropped toward the roller 27 is formed on the blanket 21 between the first patterns 23. Therefore, according to an embodiment, required processes are just two processes of forming the second patterns 33 of the printing material directly on the roller 21 and of forming the second patterns 23 on the substrate 35, so that a process can be simplified as compared to the related art.

Also, according to an embodiment, printing patterns are formed directly on the roller 21 as compared to the related art in which a photoresist pattern is formed by a photolithography process. Accordingly, a fabrication cost can be saved.

According to an embodiment, a process of forming a printing pattern using a cliché is not required. Thus, a defective printing pattern caused by a height difference of a pattern of the cliché in a printing pattern forming process using the cliché can be obviated, thereby minimizing a printing defect.

Figure 3A:
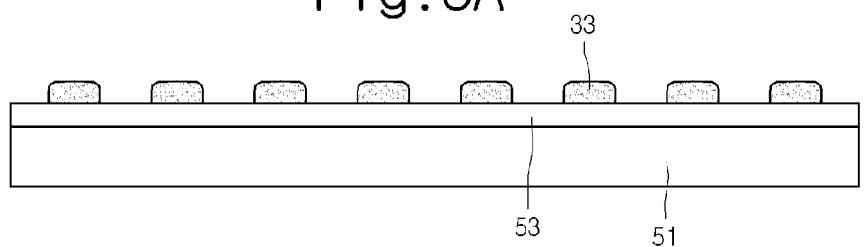
FIGS. 3A and 3B are views illustrating a process of fabricating an LCD device using a printing method according an embodiment.
Figure 3B:
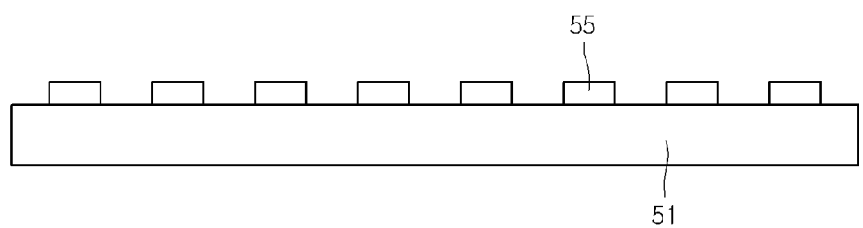

FIGS. 3A and 3B are views for explaining a fabrication process of an LCD device using a printing method according to an embodiment.

The LCD device can be easily fabricated by using the printing method described above.

Referring to FIG. 3A, a pattern material 53 for pattern formation is deposited on a substrate 51. Examples of the pattern material 53 include a gate metal layer, a semiconductor material, a source/drain metal layer, and a pixel electrode material.

As described above, after the roller 21 with a printing pattern contacts the pattern material 53, the roller 21 rotates on the pattern material 53, moving in one horizontal direction. Accordingly, a printing pattern 33 is formed on the pattern material 53.

Since the pattern material 53, particularly, a metal material has high surface-roughness, the printing pattern 33 can be easily transferred from the roller 21 onto the pattern material 53.

Referring to FIG. 3B, the pattern material 53 is patterned by using the printing pattern 33 as a mask, thereby forming a pattern 55 on the substrate 51. The pattern 55 may be one of a gate line, a gate electrode, a semiconductor layer including an active layer and an ohmic-contact layer, a data line, a source/drain electrode, and a pixel electrode.

Thereafter, the printing pattern 33 is removed, and thus only the pattern 55 remains on the substrate 51.

An LCD device can be fabricated by forming the gate line, the gate electrode, the semiconductor layer including the active layer and the ohmic-contact layer, the data line, the source/drain electrode, or the pixel electrode on the substrate 51, using the printing method according to an embodiment.

As described so far, according to an embodiment, the related art process of forming a printing pattern using a cliché is unnecessary, so that a process can be simplified as compared to the related art.

According to an embodiment, since a printing pattern is formed directly on a roller, a fabrication cost can be reduced as compared to the related art where a photoresist pattern is formed by a photolithography process.

According to an embodiment, since a process of forming a printing pattern using a cliché is unnecessary, a defective printing pattern caused by a pattern height difference of the cliché in a printing pattern forming process using the cliché is obviated. Accordingly, a printing defect can be minimized.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A printing method comprising:
    forming first patterns of a first material on a blanket of a second material which is flat, the first patterns having different surface energy from the blanket;
    attaching the blanket around a roller, wherein the blanket covering an entire circumference surface of the roller, wherein ends of the blanket are connected by using an adhering unit;
    rotating the roller and dropping a printing material to form second patterns on the blanket between the first patterns, the roller being vibrated by a vibrating motor to cause the printing material on the first patterns to flow toward the blanket so as to form the second patterns on the blanket between the first patterns; and
    transferring the second patterns onto a substrate,
    wherein the first patterns have lower surface energy than the blanket, and
    wherein the second patterns have greater thickness than the first patterns as measured perpendicularly from a surface of the blanket.

2. The printing method according to claim 1, wherein the forming of the second patterns on the blanket comprises:
    forming the printing material on the blanket including the first patterns;
    causing the printing material on the first patterns to flow toward the blanket by the difference in surface energy between the blanket and the first patterns, to form the second patterns on the blanket between the first patterns.

3. The printing method according to claim 1, wherein the blanket is formed of polydimethylsiloxane.

4. The printing method according to claim 1, wherein the first patterns are formed of polytetrafluoroethylene.

5. A roller apparatus comprising:
    a roller;
    a blanket of a first material having a first surface energy, the blanket covering an entire circumference surface of the roller and being attached around the roller;
    patterns of a second material on the blanket, the patterns having a second surface energy different from the first surface energy; and
    a vibrating motor vibrating the roller to cause a printing material to flow away from the patterns toward the blanket, wherein the patterns have lower surface energy than the blanket, and wherein ends of the blanket are connected by using an adhering unit.

6. The roller apparatus according to claim 5, wherein the blanket is formed of polydimethylsiloxane.

7. The roller apparatus according to claim 5, wherein the patterns are formed of polytetrafluoroethylene.

8. The roller apparatus according to claim 5, wherein the second surface energy of the pattern is smaller than the first surface energy of the blanket.

9. The roller apparatus according to claim 8, wherein the first surface energy ranges from approximately 22 dynes/cm$^2$ to approximately 24 dynes/cm$^2$.

10. The roller apparatus according to claim 8, wherein the second surface energy ranges from approximately 18 dynes/cm$^2$ to 20 dynes/cm$^2$.

\* \* \* \* \*